(12) United States Patent (10) Patent No.: US 8,869,087 B2
Zievers (45) Date of Patent: Oct. 21, 2014

(54) COMPUTING SYSTEM WITH DATA AND CONTROL PLANES AND METHOD OF OPERATION THEREOF

(75) Inventor: Peter J. Zievers, Naperville, IL (US)

(73) Assignee: Xcelemor, Inc., Livermore, CA (US)

(*) Notice: Subject to any disclaimer, the term of this patent is extended or adjusted under 35 U.S.C. 154(b) by 361 days.

(21) Appl. No.: 13/464,722

(22) Filed: May 4, 2012

(65) Prior Publication Data

US 2012/0284438 A1 Nov. 8, 2012

Related U.S. Application Data

(60) Provisional application No. 61/483,523, filed on May 6, 2011.

(51) Int. Cl.
*G06F 17/50* (2006.01)
*G06F 15/78* (2006.01)
*G06F 15/173* (2006.01)

(52) U.S. Cl.
CPC ............ *G06F 15/781* (2013.01); *G06F 15/173* (2013.01)
USPC .......................................................... 716/117

(58) Field of Classification Search
USPC .......................................................... 716/117
See application file for complete search history.

(56) References Cited

U.S. PATENT DOCUMENTS

| | | | |
|---|---|---|---|
| 6,292,916 B1 | 9/2001 | Abramovici et al. | |
| 6,434,687 B1 | 8/2002 | Huppenthal | |
| 6,442,732 B1 | 8/2002 | Abramovici et al. | |
| 6,470,415 B1 | 10/2002 | Starr et al. | |
| 6,697,868 B2 | 2/2004 | Craft et al. | |
| 6,941,539 B2 | 9/2005 | Hammes | |
| 6,964,029 B2 | 11/2005 | Poznanovic et al. | |
| 7,120,706 B2 | 10/2006 | Zievers | |
| 7,159,049 B2 | 1/2007 | Zievers | |
| 7,162,551 B2 | 1/2007 | Zievers | |
| 8,639,487 B1* | 1/2014 | Ezer et al. .................... | 703/14 |
| 2011/0145447 A1 | 6/2011 | Dimond | |
| 2011/0302231 A1 | 12/2011 | Huggett et al. | |
| 2012/0185809 A1* | 7/2012 | Kadiyala et al. ............. | 716/104 |

OTHER PUBLICATIONS

Babb et al., "Virtual Wires: Overcoming Pin Limitations in FPGA-based Logic Emulators", pp. 10, Publisher: MIT Laboratory for Computer Science, Published in: Cambridge, US.
Compton et al., "An Introduction to Reconfigurable Computing", p. 9, Publisher: Northwestern University, Published in: Evanston, US.
Gomez-Prado et al., "A Tutorial on FPGA Routing", p. 16, Publisher: Department of Electrical and Computer Engineering. University of Massachusetts, Published in: Amherst, US.
Todman et al., "Reconfigurable computing: architectures and design methods", "IEE Proc.-Comput. Digit. Tech., vol. 152, No. 2, Mar. 2005", Mar. 2005, p. 15, Publisher: IEEE.
Vancourt et al., "Sizing of Processing Arrays for FPGA-Based Computation", p. 6, Publisher: Boston University, Department of Electrical and Computer Engineering, Published in: Boston, US.

* cited by examiner

*Primary Examiner* — Suresh Memula
(74) *Attorney, Agent, or Firm* — Ishimaru & Associates LLP

(57) ABSTRACT

A method of operation of an computing system includes: providing a microkernel; controlling a reconfigurable hardware device by the microkernel; configuring an event scoreboard module for monitoring the reconfigurable hardware device; and implementing an application configured in the reconfigurable hardware device including receiving a machine identifier for the reconfigurable hardware device.

20 Claims, 10 Drawing Sheets

COMPUTING SYSTEM WITH DATA AND CONTROL PLANES AND METHOD OF OPERATION THEREOF

CROSS-REFERENCE TO RELATED APPLICATION

This application claims the benefit of U.S. Provisional Patent Application Ser. No. 61/483,523 filed May 6, 2011, and the subject matter thereof is incorporated herein by reference in its entirety.

TECHNICAL FIELD

The present invention relates generally to a computing system and more particularly to a computing system for hardware reconfiguration.

BACKGROUND ART

Electronic hardware with integrated circuits is used in virtually all electronic equipment today and has revolutionized the world of electronics. The integrated circuits are used in digital electronic systems, such as computers, televisions, cellular phones, mobile devices, and digital video cameras.

Typically, a general purpose computer architecture is provided that can be exercised by software, which is loaded in a supporting memory system, to enable a specific function. This combination allows a broad range of flexibility but trades performance and security. The flexibility of the system also provides a path for compromising the integrity of the application performed.

The integrated circuits, that enable virtually every electronics gadget used on a daily basis, are constantly being improved by the semiconductor industry to become faster. However, pure hardware implementation does not allow the flexibility to address the myriad of applications in modern electronic systems.

Thus, a need still remains for computing systems that provide flexibility of functions while delivering increased performance and improved security. In view of the increasing demand for computing systems with improved integration and performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a computing system including: providing a microkernel; controlling a reconfigurable hardware device by the microkernel; configuring an event scoreboard module for monitoring the reconfigurable hardware device; and implementing an application configured in the reconfigurable hardware device including receiving a machine identifier for the reconfigurable hardware device.

The present invention provides a computing system, including: a reconfigurable hardware device on a circuit board; a microkernel having an event scoreboard module coupled to the reconfigurable hardware device for monitoring the reconfigurable hardware device; and a machine identifier bus coupled to the reconfigurable hardware device for implementing an application configured in the reconfigurable hardware device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The term "module" referred to herein includes hardware in the present invention in accordance with the context in which the term is used. For example, the hardware can include circuitry, programmable circuitry, computer, integrated circuit, integrated circuit cores, a pressure sensor, an inertial sensor, a microelectromechanical system (MEMS), passive devices, or a combination thereof.

Figure 1:
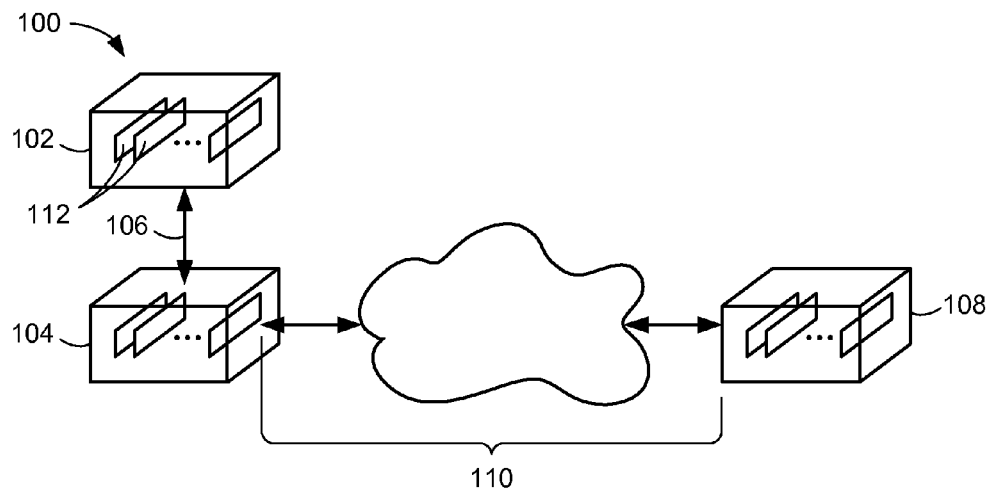
FIG. 1 is a computing system with data and control planes in an embodiment of the present invention.

Referring now to FIG. 1, therein is shown a computing system 100 with data and control planes in an embodiment of the present invention. The computing system 100 can represent an adaptive architecture execution environment (AAXE), which is a scalable hardware operating system that can be used to run applications by executing their commands in pre-configured hardware.

The computing system 100 can include a first electronic equipment 102 connected to a second electronic equipment 104 through a first communication path 106. The computing system 100 can include a third electronic equipment 108 connected to the second electronic equipment 104 through a second communication path 110.

For example, the first electronic equipment 102, the second electronic equipment 104, or the third electronic equipment 108 can represent a stationary device or a mobile device. As specific examples, the first electronic equipment 102, the second electronic equipment 104, or the third electronic equipment 108 can be a server, a server farm, a computer, a grid-computing resource, a virtualized computer resource, a cloud computing resource, a router, a switch, a peer-to-peer distributed computing device, a network equipment, a storage enclosure, or a combination thereof. As additional specific examples, the first electronic equipment 102, the second electronic equipment 104, or the third electronic equipment 108 can be a cellular phone, a personal digital assistant, a notebook computer, a multi-functional mobile communication device, or an entertainment device.

The first communication path 106, as an example, can represent a wireless network, a wired network, or a combination thereof for box-to-box connectivity. The first communication path 106 can include wireless communication, wired communication, optical, ultrasonic, or a combination thereof. Bluetooth, Infrared Data Association standard (IrDA), wireless fidelity (WiFi), and worldwide interoperability for microwave access (WiMAX) are examples of wireless communication for the first communication path 106. Ethernet, Fiber Channel, and Peripheral Component Interconnect (PCI) are also examples of wired communication for the first communication path 106.

The second communication path 110, for example, can represent a wireless network, a wired network, or a combination thereof for connectivity over a network. The second communication path 110 can include wireless communication, wired communication, optical, ultrasonic, cloud network, or a combination thereof. Satellite communication, cellular communication, Bluetooth, Infrared Data Association standard (IrDA), wireless fidelity (WiFi), and worldwide interoperability for microwave access (WiMAX) are examples of wireless communication for the second communication path 110. Ethernet, digital subscriber line (DSL), fiber to the home (FTTH), and plain old telephone service (POTS) are also examples of wired communication for the second communication path 110.

Further, the second communication path 110 can traverse a number of network topologies and distances. For example, the second communication path 110 can include direct connection, personal area network (PAN), local area network (LAN), metropolitan area network (MAN), wide area network (WAN), or any combination thereof. Also for example, the second communication path 110 can support timing requirements or quality of service (QoS) features.

Each of the first electronic equipment 102, the second electronic equipment 104, and the third electronic equipment 108 can include a number of line cards 112, which are defined as modular electronic sub-systems. The line cards 112 can be connected through a backplane or by cables for inside-a-box connectivity. The line cards 112 can be connected together using connectivity methods including electrical connectors, optical fiber connectors, or wave-guide connectors.

The line cards 112 can include electronic components including an application-specific integrated circuit (ASIC), a field-programmable gate array (FPGA), or a combination thereof. For example, the line cards 112 can represent server blades, expansion cards, or interface cards for routers or switches.

Figure 2:
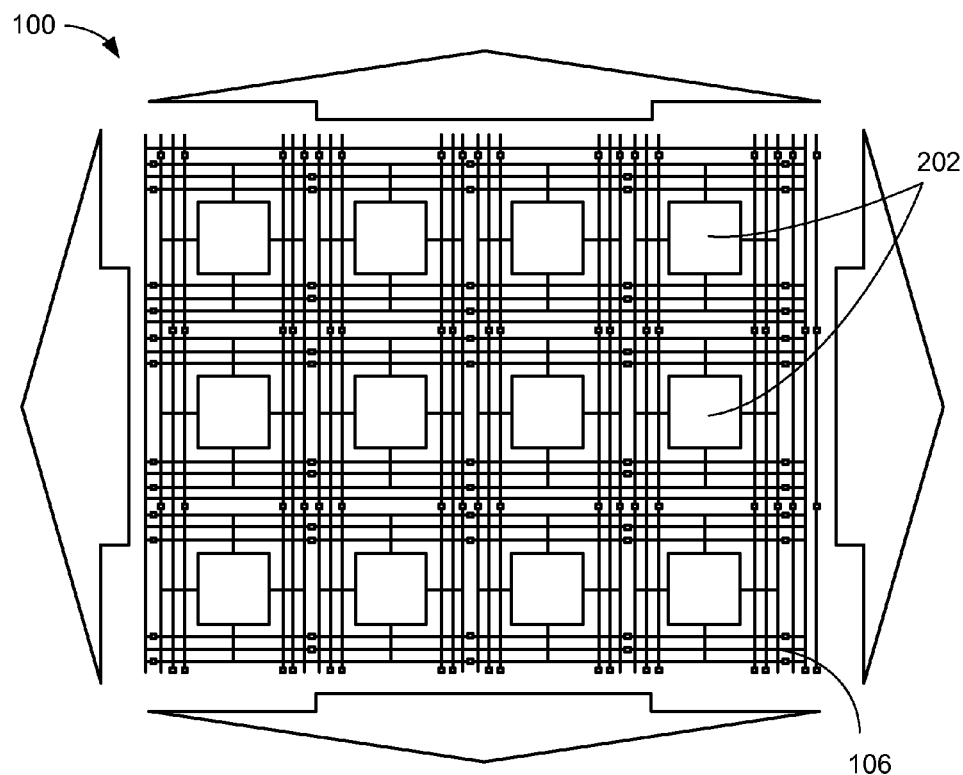
FIG. 2 is an architecture diagram of the computing system.

Referring now to FIG. 2, therein is shown an architecture diagram of the computing system 100. The computing system 100 can include a number of reconfigurable hardware devices 202. The reconfigurable hardware devices 202 are defined as programmable devices in which circuit resources have the functionality of logic gates, storage elements, and interconnections are customizable at run-time or dynamically configured during operation to include or change functions within the programmable devices.

The reconfigurable hardware devices 202 can represent the programmable devices with a configurable pool of programmable blocks and reconfigurable interconnects. For example, the reconfigurable interconnects can represent wires or zero-delay interconnection resources. The architecture diagram depicts arrows to indicate that any number of circuit resources of the reconfigurable hardware devices 202 can be placed, routed, and interconnected.

Placement, routing, and interconnections among a number of the circuit resources of the reconfigurable hardware devices 202 can be configured at run-time. The circuit resources of the reconfigurable hardware devices 202 can be placed and routed, to interconnect or interface between multiple instances of the reconfigurable hardware devices 202, on one or more of the line cards 112 of FIG. 1.

For example, the reconfigurable hardware devices 202 can include field-programmable gate arrays (FPGAs), programmable logic devices (PLDs), or any other programmable hardware devices. Also for example, the reconfigurable hardware devices 202 can represent target programmable devices. Further, for example, interconnections between the reconfigurable hardware devices 202 can represent the first communication path 106 of FIG. 1, the second communication path 110 of FIG. 1, a backplane, or cables for inside-a-box connectivity.

Transparent interconnection of an arbitrary number of the reconfigurable hardware devices 202 can enable scalability. Any delay incurred by traversing the first communication path 106, such as a network, can be regulated by managing the number of hierarchical levels in the first communication path 106 at implementation time, or managing the locality of the application at run time. The first communication path 106 requires management to be effective. Applications can discreetly avail themselves of network management functionality through an abstracted control interface (not shown), leaving complex network maintenance to logic that operates separately from the application.

Figure 3:
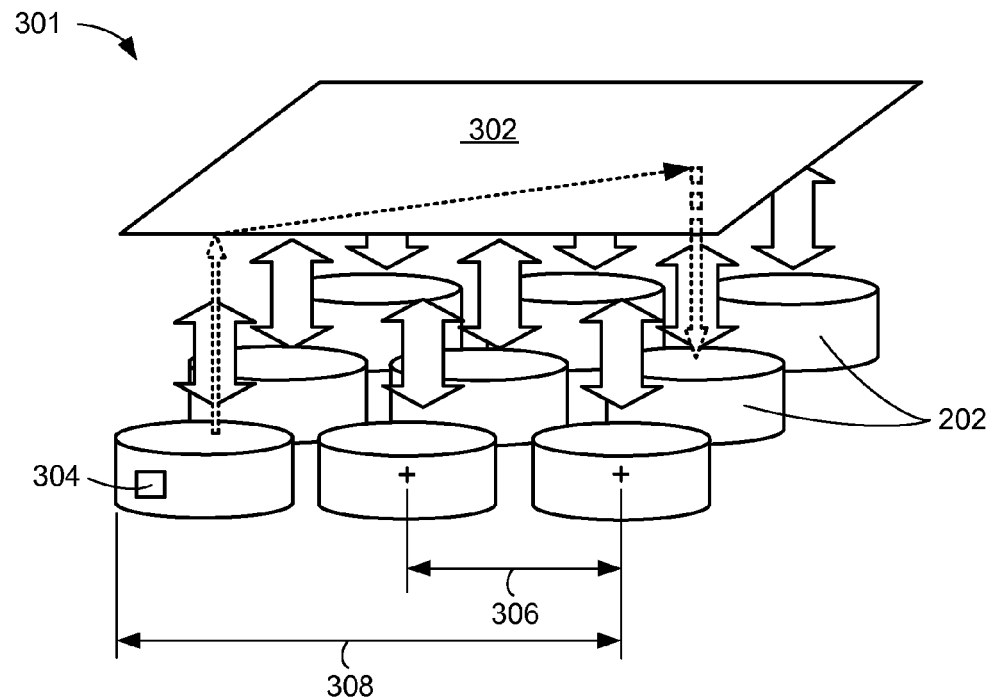
FIG. 3 is a connection diagram of a cross-connection network of the reconfigurable hardware devices.

Referring now to FIG. 3, therein is shown a connection diagram of a cross-connection network 301 of the reconfigurable hardware devices 202. The connection diagram of the cross-connection network 301 depicts a hierarchical connection through a cross-connection structure 302 that enables the reconfigurable hardware devices 202 to communicate between each other. The cross-connection network 301 is defined as a coupling medium for communication, control, and coordination of any attached hardware resources.

One of the reconfigurable hardware devices 202 can interface to another of the reconfigurable hardware devices 202 through the cross-connection structure 302 in a variable path as shown by the dash arrows. For example, the cross-connection structure 302 can include a programmable switched fabric for providing the interconnections between the reconfigurable hardware devices 202.

Any delay incurred by traversing the cross-connection structure 302 can be regulated by managing a number of hierarchical levels constructed in the circuit resources of the reconfigurable hardware devices 202 coupled through the cross-connection structure 302 at implementation time. The implementation time is defined as the time when configuration of the circuit resources of the reconfigurable hardware devices 202 is committed. The hierarchical levels of the cross-connection network 301 can include the reconfigurable hardware devices 202, the line cards 112 of FIG. 1, the second communication path 110 of FIG. 1, or a combination thereof which can be connected through the cross-connection structure 302.

The delay can also be regulated by managing a locality of an application 304, within the circuit resources of the reconfigurable hardware devices 202 at the implementation time. The application 304 is defined as a compute resource for a specific purpose that is to be launched by a user and executed by the circuit resources of the reconfigurable hardware devices 202 in the computing system 100. For illustration purposes, one of the reconfigurable hardware devices 202 is shown to contain the application 304, although it is understood that the application 304 can be instantiated across any number of the reconfigurable hardware devices 202 having circuit resources that can be allocated to execute the application 304.

The locality can be provided by mapping the application 304 to one of the reconfigurable hardware devices 202 or multiple of the reconfigurable hardware devices 202 that are within a predetermined distance 306 from each other. The predetermined distance 306 is a distance between centers of the reconfigurable hardware devices 202 that is less than a distance threshold 308 to ensure a propagation delay of less than a fixed numerical value. The distance threshold 308 is a predefined numerical value for determining whether the reconfigurable hardware devices 202 are locally or closely located to each other.

The cross-connection network 301 can include management functions to be effective. Any number of the application 304 can discreetly operate within the network management functionality through a control interface, leaving complex network maintenance to logic that operates separately from the application 304.

A single application management strategy can be applied to pre-empt or prevent occurrences of mismatched approaches, which are multiple methods of a variety of subsystems having conflicting effects in an overall system. The single application management strategy provides a single coordination to ensure resources are available for use.

For example, the occurrences can include resource leakage, resource collision, resource starvation, application priority deadlock, namespace conflict, cross-thread run-time synchronization failure, and cross-thread communication disconnect. As a specific example, the resource leakage occurs when applications do not use the circuitry resources allocated to them. As another specific example, the resource collision occurs when multiple devices or processes access the same instances of the circuit resources.

As another specific example, the resource starvation occurs when the resources are not allocated for execution of a subsequent process because they are used for execution of a prior process having a higher priority than the subsequent process. As another specific example, the application deadlock occurs when two or more processes are simultaneously waiting for each other to relinquish particular circuit resources.

Application logic that is not able to be fit or implemented in a single instance of the reconfigurable hardware devices 202 can require application synchronization at device input ports of each of the reconfigurable hardware devices 202 that are used to implement and execute the application logic. Multiple approaches to the application synchronization can be supported assuming orthogonal application domains, which are groups of applications that are different and operate independently from each other.

The number of the application 304 can coexist in the computing system 100 and therefore can use the same system resources including a memory control interface (not shown) and a network control interface (not shown). Consistency of the application synchronization that applies the same terms and protocols can promote application independence and therefore scalability.

Figure 4:
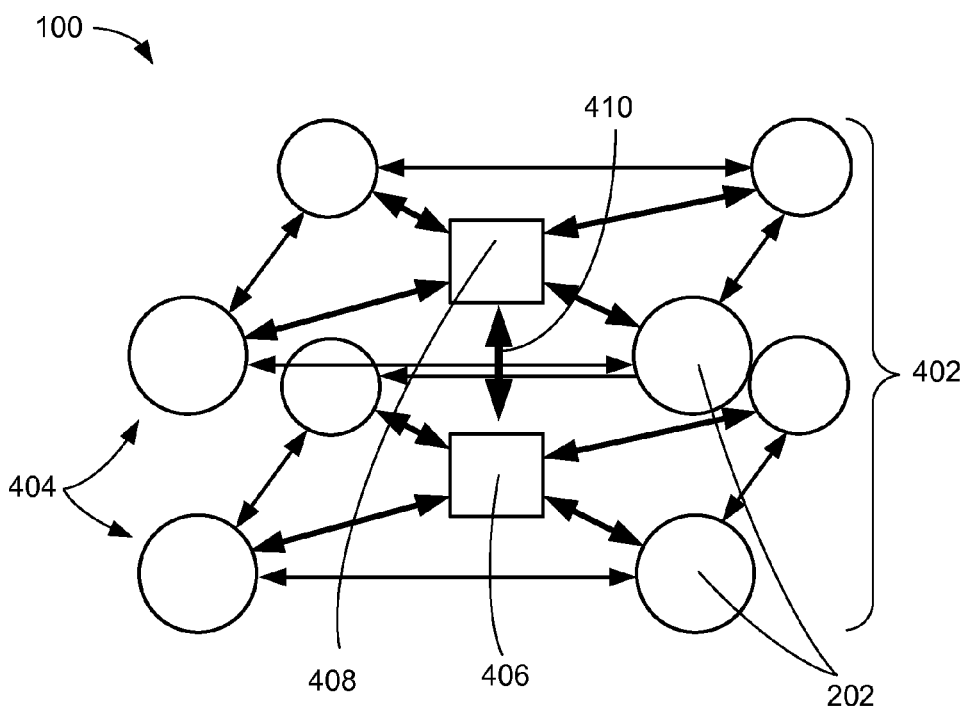
FIG. 4 is a connection diagram of a tandem kernel of the computing system.

Referring now to FIG. 4, therein is shown a connection diagram of a tandem kernel 402 of the computing system 100. The tandem kernel 402 is defined as more than one of clusters 404 connected together.

Each of the clusters 404 is defined as a collection of the reconfigurable hardware devices 202 connected to a first kernel unit 406 or a second kernel unit 408, whereby the reconfigurable hardware devices 202 are locally located with respect to one another. The term "locally located" refers to the reconfigurable hardware devices 202 within the predetermined distance 306 of FIG. 3 from one another and can include coupling through a communication structure 410. The computing system 100 can include a number of the clusters 404 connected together through a number of the first kernel units 406. Each of the first kernel units 406 is defined as a management hardware that includes application management, communication, and synchronization functionality.

The connection diagram depicts the tandem kernel 402 having the first kernel unit 406 connected to a second kernel unit 408, with each of the first kernel unit 406 and the second kernel unit 408 having four instances of the reconfigurable hardware devices 202. Within the tandem kernel 402, one of the reconfigurable hardware devices 202 of the first kernel unit 406 can interface with one of the reconfigurable hardware devices 202 of the second kernel unit 408.

One of the reconfigurable hardware devices 202 can interface with another of the reconfigurable hardware devices 202 within one of the clusters 404 preferably through the first kernel unit 406 or the second kernel unit 408, to which they are attached, of the one of the clusters 404. Optionally, one of the reconfigurable hardware devices 202 of one of the clusters 404 can interface directly with another of the reconfigurable hardware devices 202 within the same one of the clusters 404. Any interconnections between the reconfigurable hardware devices 202 can represent portions of the cross-connection network 301 of FIG. 3.

It has been discovered that each of the clusters 404, having one of the first kernel unit 406 or the second kernel unit 408, provides improved dynamic allocation of hardware resources because the application 304 of FIG. 3 can be fragmented, mapped, and executed within any number of the circuit resources of the reconfigurable hardware devices 202 managed by the first kernel unit 406 or the second kernel unit 408.

It has also been discovered that any number of the reconfigurable hardware devices 202 can directly interface with each other within one of the clusters 404 in order to provide improved performance with less delays through direct connections while providing reduced cost and complexity.

It is understood that the configuration having four of the reconfigurable hardware devices 202 cross-connected with the first kernel unit 406 or the second kernel unit 408 is an example of the adaptive architecture execution environment (AAXE) and any number of the reconfigurable hardware devices 202 can be so coupled. It is further understood that the coupling of the first kernel unit 406 and the second kernel unit 408 through the communication structure 410 is an example and additional kernel units may be so coupled.

Figure 5:
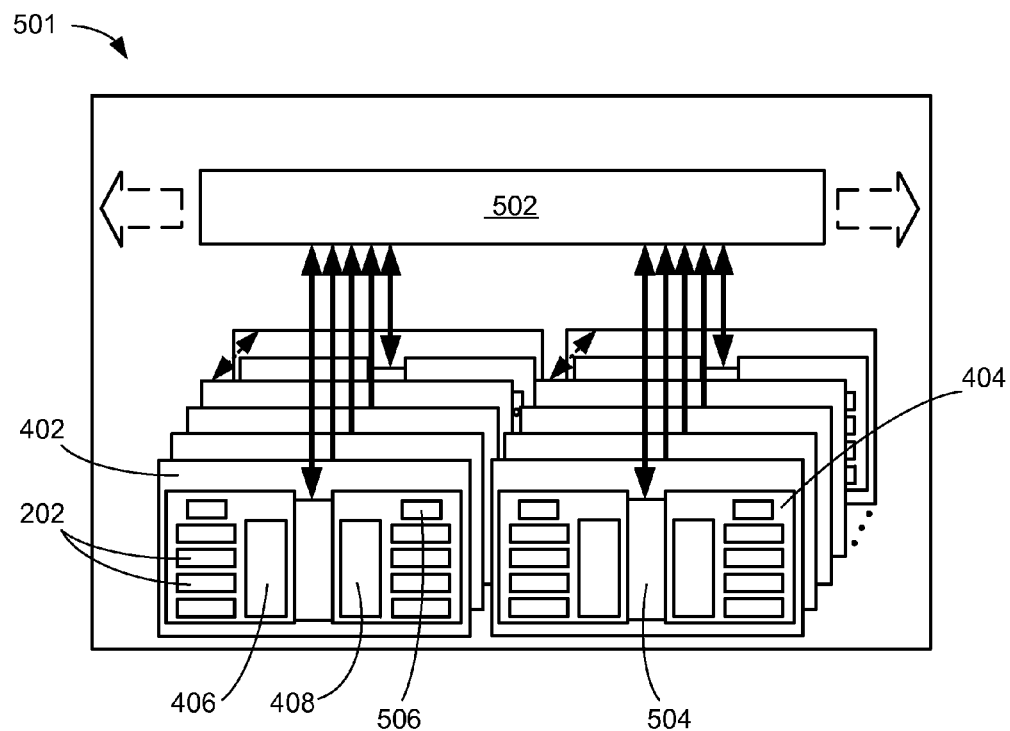
FIG. 5 is a hardware block diagram of the computing system.

Referring now to FIG. 5, therein is shown a hardware block diagram of the computing system 501. The computing system 501 includes a hardware platform having a number of the tandem kernel 402 implemented on printed circuit boards. The computing system 501 can include a number of the first kernel unit 406, the second kernel unit 408, the reconfigurable hardware devices 202, and a communication network 502 that can be engaged and interworking.

The computing system 501 includes a dynamic reconfigurable computing platform without any application software utilization during real-time operation. For example, the computing system 501 can provide a complete hardware compute platform for implementing the application 304 of FIG. 3.

The communication network 502 provides an interface and connectivity for the tandem kernel 402 to communicate with another of the tandem kernel 402. The communication network 502 can include switches and communication protocols for sending information and data between one of the first kernel unit 406 of the tandem kernel 402 to one of the first kernel unit 406 of another of the tandem kernel 402. It is understood that communication network 502 can provide a communicative coupling between any of the reconfigurable hardware devices 202 coupled to any of the first kernel unit 406 or the second kernel unit 408 on any of the tandem kernel 402.

The tandem kernel 402 can include a communication interface 504 to provide a cohesive communication between the tandem kernel 402 and another of the tandem kernel 402. For example, the communication interface 504 can represent a network interface.

The communication interface 504 can be used for one of the kernel units 406 of the tandem kernel 402 to communicate with one of the kernel units 406 of another of the tandem kernel 402 through the communication network 502. The communication network 502, the communication interface 504, a number of the kernel units 406, or a combination thereof can represent portions of the cross-connection structure 302 of FIG. 3. For example, a number of the tandem kernel 402 can be included on a number of the line cards 112 of FIG. 1. Also for example, a number of the tandem kernel 402 can represent the first electronic equipment 102 of FIG. 1, the second electronic equipment 104 of FIG. 1, or the third electronic equipment 108 of FIG. 1.

The computing system 501 can accommodate a number of different models of the reconfigurable hardware devices 202, each of which can include different input/output (I/O) densities and different computing resources. Suitability of the reconfigurable hardware devices 202 can depend on an application descriptor 506, which is defined as information regarding the make-up of the application 304 that determines how the circuit resources of the reconfigurable hardware devices 202 are to be allocated for implementing the application 304. The application descriptor 506 may comprise resource requirements for implementing the application 304.

The application descriptor 506 can include the operation feature including input/output-intensive (I/O-intensive) or compute-intensive. For example, the application descriptor 506 can be used to determine a mix of the circuit resources of the reconfigurable hardware devices 202 committed to the application 304.

I/O-intensive refers to the application 304 that is preferably mapped to the reconfigurable hardware devices 202, which can support a high I/O activity. The high I/O activity refers to a number of input and output ports of a programmable hardware resource greater than a predefined numerical value of input and output ports. For example, the predefined numerical value of input and output ports can be 600. Also for example, I/O-intensive can represent I/O-heavy or high I/O density.

Compute-intensive refers to the application 304 that is preferably mapped to programmable hardware resources with a high compute resource capacity. Compute-intensive applies to the application 304 that demands a lot of computation compared to I/O-intensive that requires more input/output operations.

The application 304 that is I/O-intensive can be placed, routed, and executed more efficiently using a selected model of the reconfigurable hardware devices 202 that is designed for I/O-intensive applications than those for compute-intensive applications. The application 304 that is compute-intensive can be placed, routed, and executed more efficiently using a different model of the reconfigurable hardware devices 202 that is designed for resource-intensive rather than those for I/O intensive.

The computing system 501 can be tuned or configured by mixing the clusters 404 differently based on the application descriptor 506. The clusters 404 can represent kernel planes. For example, the application descriptor 506 of the application 304 can be particularly I/O-intensive but the application 304 has compute-intensive ancillary functionality that is most frequently unused.

In the example above, the clusters 404 populated with high I/O density instances of the reconfigurable hardware devices 202 can be employed for execution of basic functionality of the application 304. In addition, the clusters 404 populated with compute resource intensive instances of the reconfigurable hardware devices 202 can be employed for execution of the compute-intensive ancillary functionality that is swapped in and out of the compute resource intensive instances of the reconfigurable hardware devices 202.

Each of the clusters 404 can be analyzed to estimate an amount of time for executing a functionality of the application 304 based on an actual capacity (or size) and an actual I/O density of the reconfigurable hardware devices 202 that are used to map the application 304. As an application mix of a number of the application 304 runs in the computing system 501, performance can be measured and a mix of the clusters 404 can be adjusted according to actual run-time characteristics. The application mix refers to the number of the application 304 that need to be mapped to resources that are I/O-intensive, compute-intensive, or a combination thereof.

Placement of the clusters 404 can depend on the application mix. If an I/O-intensive functionality of the application 304 is localized in the reconfigurable hardware devices 202, the clusters 404 that are I/O-intensive can be clustered together, thereby decongesting the communication network 502 of the computing system 501. If an I/O-intensive functionality of the application 304 functions as a hub for a compute-intensive functionality, the clusters 404 that are I/O-intensive can be distributed amongst the clusters 404 that are compute-intensive.

Figure 6:
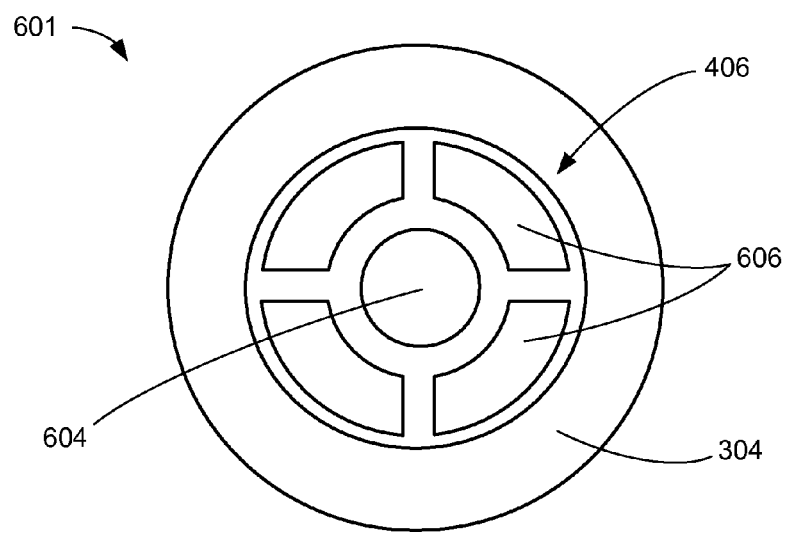
FIG. 6 is an architecture diagram of the application in the computing system.

Referring now to FIG. 6, therein is shown an architecture diagram of the application 304 in the computing system 601. Each of the first kernel unit 406 can include a microkernel 604 and kernel modules 606. The microkernel 604 can provide control, management, and communication capabilities for each of the first kernel unit 406 to interface with the reconfigurable hardware devices 202 of FIG. 2 to implement and execute functionality of the application 304.

The kernel modules 606 augments functionality of the microkernel 604 by providing additional control and management capabilities that are not implemented in the microkernel 604. The first kernel unit 406 can be configured for the application 304 by compiling and synthesizing the kernel modules 606 expressly chosen for an application domain of the application 304. The application 304 can be loaded and executed on the circuit resources of the reconfigurable hardware devices 202.

It is understood that the microkernel 604 and the kernel modules 606 are attributes of the first kernel unit 406 and the second kernel unit 408. While the discussion is limited to the first kernel unit, this is done for ease of understanding and is not intended to limit the invention.

The application domain refers to a type of a number of the application 304 that are based on similar functionalities. The application domain depends on computation that the number of the application 304 is implemented to execute. For example, the application domain can include encryption, computer vision, and synthetic-aperture radar that can be supported with high-performance computing functionalities implemented in the number of the application 304.

The application 304 can be launched in a layer outside each of the first kernel unit 406 having the microkernel 604 and the kernel modules 606. For example, the application 304 can be developed using a programming language including C++ and VHSIC hardware description language (VHDL) where VHSIC stands for very-high-speed integrated circuits. Also for example, the application 304 can be developed with Open Computing Language (OpenCL) programs and compiled to run with an execution platform with only hardware using the circuit resources of the reconfigurable hardware devices 202.

The application 304 can be mapped to and executed by any of the reconfigurable hardware devices 202 that can provide the necessary hardware resources. A process of mapping and implementing a representation or a bitstream of the application 304 can be managed by each of the kernel units 406 having the microkernel 604 and the kernel modules 606.

Figure 7:
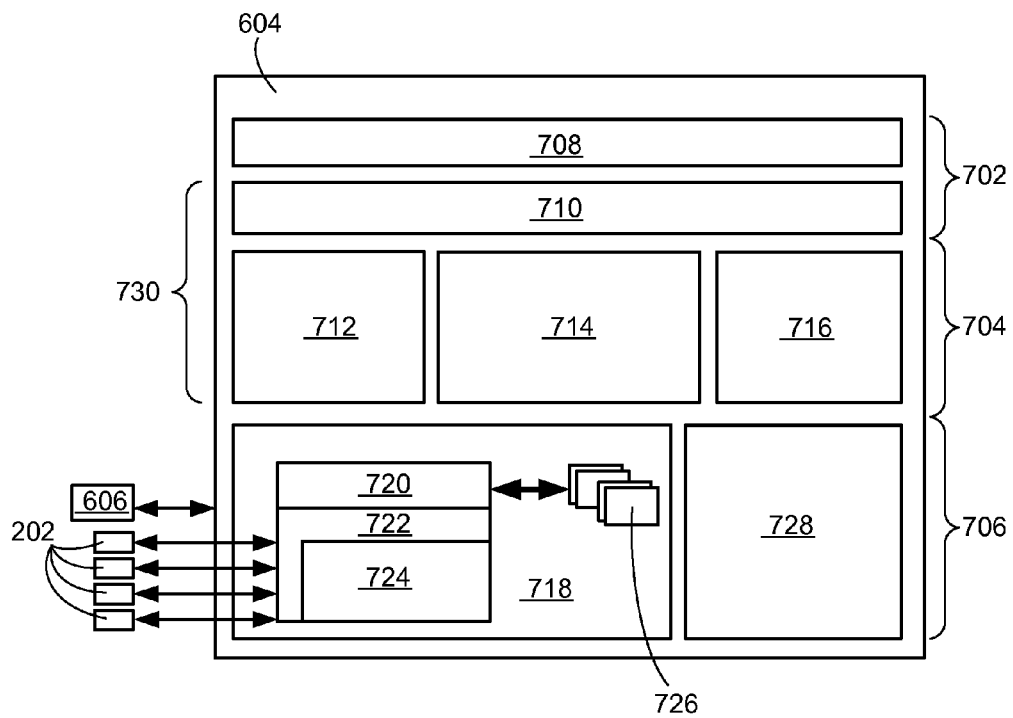
FIG. 7 is a hardware block diagram of the microkernel of FIG. 6.

Referring now to FIG. 7, therein is shown a hardware block diagram of the microkernel 604 of FIG. 6. The microkernel 604 can be implemented with vital functions common to various types of a number of the application 304 of FIG. 3 that operates in a similar fashion across all application domains. The microkernel 604 does not operate in a stand-alone form but instead with the kernel modules 606.

The microkernel 604 can include operation functions including communications, logic multiplexing, security primitives, job scheduling, and distributed control. The microkernel 604 is an interworking system of sub-functions, organized as shown in FIG. 7. The microkernel 604 can include the sub-functions that are stratified into three layers including a control layer 702, a support layer 704, and a run-time layer 706.

The control layer 702 performs a job control function and includes a microkernel interface (not shown). The control layer 702 can include a user interface unit 708 and an application manager 710 for performing control functions including session management, control plane security, and job scheduling.

The support layer 704 provides scheduling support and network management. The support layer 704 can include a module manager 712, a resource manager 714, and an event manager 716 for performing support functions including scenario validation, event handling, and remote kernel interface management.

The run-time layer 706 provides an application run-time plant. The run-time layer 706 can include run-time blocks including an intra-cluster communication unit 718 having a buffer manager 720 and a virtual bus 722 with a switch fabric 724. The run-time layer 706 can include the run-time blocks including a number of memory devices 726 and an inter-cluster communication unit 728. The run-time layer 706 can include the run-time blocks for performing run-time functions including interfacing with the reconfigurable hardware devices 202 and performing application fragment interconnect, signal management, network interface, and network and application interface security.

The microkernel 604 can include a schedule engine 730 for scheduling portions of a number of the reconfigurable hardware devices 202. The schedule engine 730 can include the application manager 710, the module manager 712, the resource manager 714, and the event manager 716 to support the scheduling.

Sub-blocks of the control layer 702, the support layer 704, and the run-time layer 706 can be connected to each other, the reconfigurable hardware devices 202, and the kernel modules 606. The control layer 702 can interface with the kernel modules 606 and the support layer 704. The support layer 704 can interface with the control layer 702 and the run-time layer 706. The run-time layer 706 can interface with the support layer 704, the reconfigurable hardware devices 202, and the kernel modules 606.

The microkernel 604 can be implemented as a functional foundation for the computing system 100 of FIG. 1, upon which the application 304 can be built such that the application 304 is secure, seamless, and able to be independently executed in a multi-threaded environment with others of the application 304. The microkernel 604 can embody a coherent collection of functionality appropriate hardware for implementing the application 304.

The microkernel 604 can provide primitives that implement functionality including application module scheduling and maintenance, seamless application fragment interaction, and high-performance application communication. The term "primitives" refers to a collection of simple operations that can be ordered and sequentially executed for executing a relatively more complex operation. For example, the primitives can represent low-level commands that are used to execute relatively high-level operations.

For example, the application module scheduling and maintenance can include thread maintenance and module swapping. Also for example, the seamless application fragment interaction can include interconnection and synchronization.

The thread maintenance monitors instantaneous application needs and regulates allocation of resources to the application 304. The thread maintenance is performed for multiple applications or processes that can be concurrently executing.

For example, the thread maintenance can monitor the instantaneous application needs of the application 304 and allocate ancillary logic within the circuit resources of the reconfigurable hardware devices 202 that has been committed to be used by the application 304. The term "ancillary" refers to uncommitted logic gates that are utilized to implement a function and released to be available to implement another function when the application 304 has completed and is decimated. Also for example, the thread maintenance can determine that a pipeline stall associated with feedback can require treatment.

The module swapping circumscribes or includes functionality associated with process scheduling including networked database support, identification of appropriate application fragment, run-time application fragment place and route, attachment and registration of application fragment alarms, and intra-application fragment signal handling configuration.

For the seamless application fragment interaction, the microkernel 604 can facilitate run-time synchronization at application grain boundaries including flow-control and management of pipeline stalls involving pipelines that span the application grain boundaries. The term "fragment" refers to a portion of the application 304.

The microkernel 604 can also provide for bus interconnection and reliable delivery of application signal information from outputs to fanned-out inputs at application fragment grain boundaries. The application fragment grain boundaries are perimeters of groups of programmable blocks in the reconfigurable hardware devices 202, where interconnects or wires are connected between the groups.

For the high-performance application communication, the microkernel 604 can provide a low-overhead communication infrastructure to the application 304 developed as any combination of software and hardware on top of or outside the microkernel 604 and the kernel modules 606. Wrappers or interfaces for the application 304 can be written in hardware or software outside the microkernel 604 and the kernel modules 606 to seamlessly adapt the low-overhead communication infrastructure to a number of protocols.

Figure 8:
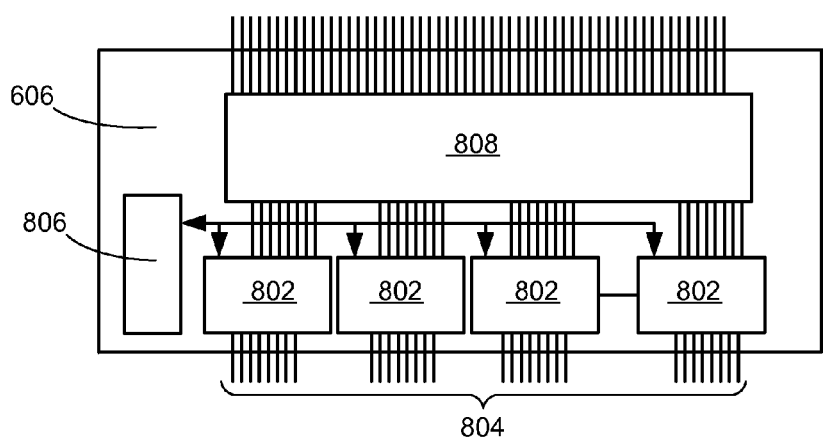
FIG. 8 is an architecture diagram of one of the kernel modules of FIG. 6.

Referring now to FIG. 8, therein is shown an architecture diagram of one of the kernel modules 606 of FIG. 6. The first kernel unit 406 of FIG. 4 and the second kernel unit 408 of FIG. 4, can each include the kernel modules 606 in addition to the microkernel 604 of FIG. 6 in order to provide hardware platform functionality that can spread across a number of the line cards 112 of FIG. 1, the tandem kernel 402 of FIG. 4, the first kernel unit 406, or a combination thereof. The first kernel unit 406 can be shaped or configured to best support the application domain with the kernel modules 606.

Each of the kernel modules 606 can include a microkernel interface block 802. The microkernel interface block 802 provides communication capability for each of the kernel modules 606 to communicate with the microkernel 604 through a kernel expansion bus 804. The kernel expansion bus 804 provides connectivity between the microkernel interface block 802 and the microkernel 604.

The microkernel interface block 802 can support a variety of bus widths and protocols appropriate to functionality of the microkernel 604. Each of the kernel modules 606 can include a security block 806 to monitor a kernel module security status and determine whether each of the first kernel unit 406 operates in a secured mode.

Each of the kernel modules 606 can include an application manager block 808 that interfaces between the microkernel interface block 802 and user logic devices (not shown). The user logic devices are non-kernel logic devices that are implemented outside the first kernel unit 406. The user logic devices can be used to transmit application related information of the application 304 of FIG. 3 that can be processed by the first kernel unit 406 for authentication, configuration, and management of the reconfigurable hardware devices 202 of FIG. 2. For example, the application manager block 808 can interface with the user logic devices through a communication bus including Peripheral Component Interconnect (PCI) or a system bus on a motherboard or a system board.

The application manager block 808 includes developed supplemental logic to support a number of configuration functionalities. For example, the configuration functionalities can be associated with the policy applied to the concurrent execution of independent instances of the application 304 including module swapping rules, privilege and authentication rules, scheduling rules, function cache allocation, database management, and managing events and event relationships. Also for example, the configuration functionalities can be associated with interface domain diversity, high-usage application domain functions, issues of waiting logic, and system scalability.

For a specific example, interface domain diversity can imply behavioral sub-classification. In other words, the kernel modules 606 house or include interface functionality based on a sub-classification because different interface domains have different characteristics. For instance, the different characteristics or differentiation can be based on speed and latency. Latency can be affected by inherent equipment constraints or by physical distance between nodes that represent locations of the reconfigurable hardware devices 202.

The kernel modules 606 can be implemented with the functionalities based on application parameters or features that are not implemented in the microkernel 604. For example, the kernel modules 606 can be implemented with functionalities including support for shell programs and file systems.

The microkernel 604 and the kernel modules 606 can be implemented with any number of electronic components including an application-specific integrated circuit (ASIC) or a field-programmable gate array (FPGA). For example, the microkernel 604 and the kernel modules 606 can be implemented with an ASIC, an FPGA, or a combination thereof.

Figure 9:
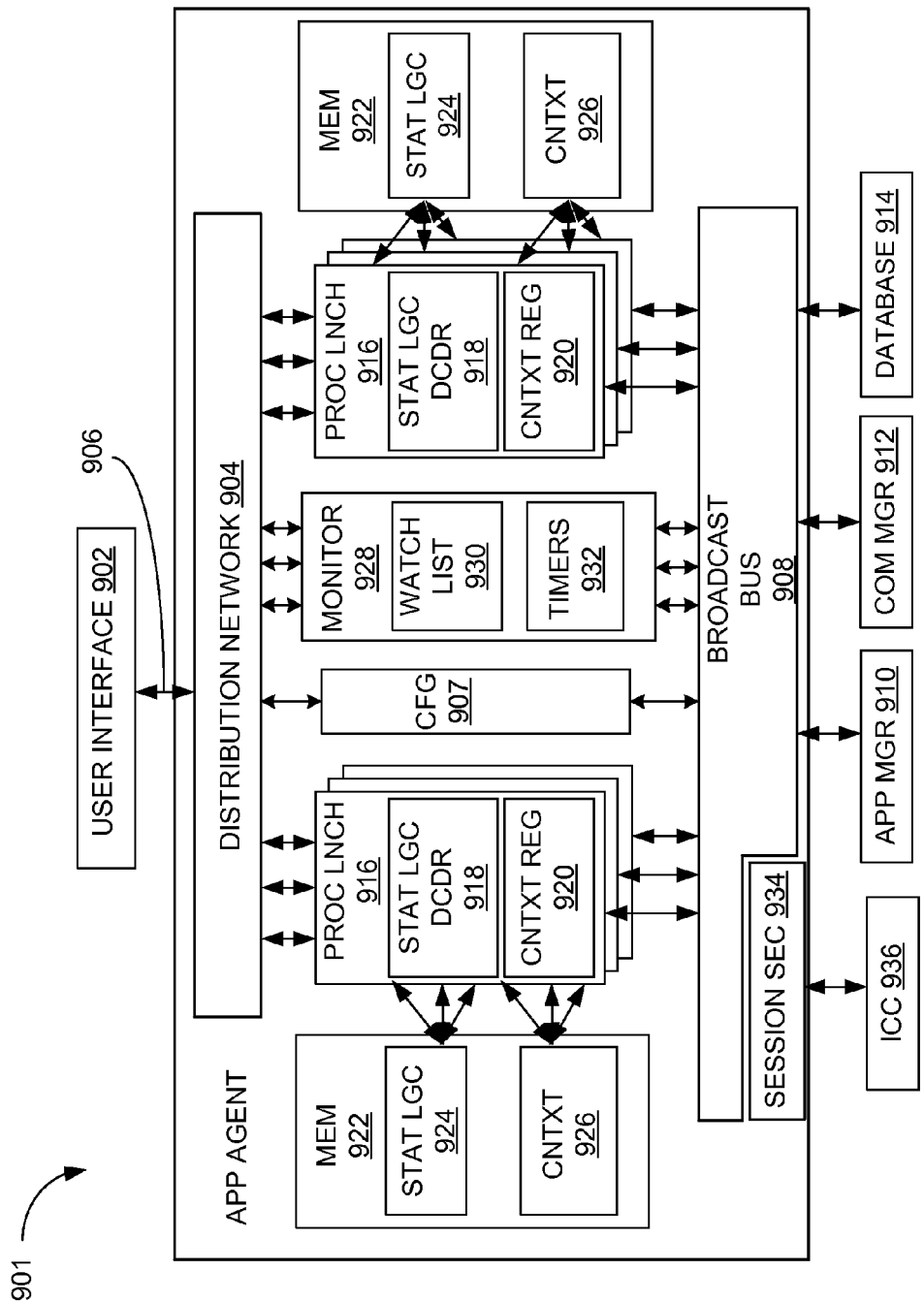
FIG. 9 is a hardware block diagram of an application agent module in an embodiment of the application manager block of FIG. 8.

Referring now to FIG. 9, therein is shown a hardware block diagram of an application agent module 901 in an embodiment of the application manager block 808 of FIG. 8. The hardware block diagram of the application agent module 901 depicts a user interface port 902 electrically and communicatively coupled to an application distribution network 904. The user interface port 902 can provide operational parameters to the logic of the microkernel 604 of FIG. 6 through a dynamically partitionable, parallel interface to a distribution bus structure 906. A partition command sent to a configuration module 907 sets the distribution bus structure 906 into a configuring state.

When the support logic of the configuration module 907 stabilizes the new partition, the distribution bus structure 906 enters an operational state. The commands transfer transparently through the user interface port 902, depending on the access permissions of the user attempting to submit a command.

The application distribution network 904 is the access point of an application agent module 901, which is a queued bus with lookahead, relaxing head-of-line constraint. The lookahead feature of the application agent module 901 permits stalled commands to be shuttled to a waiting area while other commands continue and execute. The outbound side of this lookahead queue provides a broadcast bus 908 with a selector from each potential recipient port residing on an application manager 910, a communication manager 912, a database 914, or a combination thereof.

A process launch module 916 provides the coordination of command execution resources. The process launch module 916 includes a state logic decoder 918 and a context register 920 that provide an inventory of the circuit resources of the reconfigurable hardware devices 202 of FIG. 2 available to implement the desired command execution.

The process launch module 916 is supported by a state memory structure 922. The state memory structure 922 includes a state logic segment 924 for maintaining the status of which of the circuit resources are committed and which resources are available for further implementation. The state logic segment 924 can be implemented by a combination of support hardware and memory elements within the state memory structure 922.

A context segment 926 in the state memory structure 922 maintains the context of all of the circuit resources of the reconfigurable hardware devices 202 that are currently committed to command execution. By keeping a comprehensive inventory of the circuit resources of the reconfigurable hardware devices 202, the process launch module 916 can enable the execution of commands that support the applications 304 of FIG. 3.

The consolidated resources of the state memory structure 922 facilitates multiple machine or process management sessions, which can be managed by the process launch module 916. The use of the state memory structure 922 to hold the programming and the operational state of the machine or process operation also compacts the logic to provide an efficient use of the circuit resources of the reconfigurable hardware devices 202. The logic of the state logic decoder 918 formulates the commands for the applications 304 and dispatches the commands in the form of committed hardware circuitry of the reconfigurable hardware devices 202. When appropriate, commands from the process launch module 916 can be issued concurrently and in parallel from each of the instances of the process launch module 916.

A process monitor 928 receives information through the broadcast bus 908. The process monitor 928 includes a watch list module 930 and a bank of timers 932. The combination of the watch list module 930 and the bank of timers 932 provide a view of the utilization of the circuit resources of the reconfigurable hardware devices 202 that will be available for reconfiguration and incorporation in the execution of additional commands of the applications 304.

It has been discovered that the combination of the process launch module 916 and the process monitor 928 can provide the lookahead capability required to support the timely execution of applications 304 multi-threaded for execution by the hardware based adaptive architecture execution environment.

A session security module 934 authenticates user bit streams entering and leaving an Intra-Cluster Communication module 936 via the application agent 906. The session security module 934 performs certificate inspection and a permissions check for a requested command execution. If the session security module 934 determines that insufficient credentials are present for the command execution a notification can be sent to the user interface module 902 via event generation. An event manager (not shown) promptly and in orderly fashion delivers this information to all the subscribers enabling an immediate and sweeping response to an application operating in error.

It is understood that while the description of the application agent 906 has discussed a single instance of the process launch module 916 and the process monitor 928 more than one of each of the process launch module 916 and the process monitor 928 can be implemented. It is further understood that the microkernel 604 can access multiple instances of the application agent 906 for increasing the execution capacity of the computing system 100 of FIG. 1.

Figure 10:
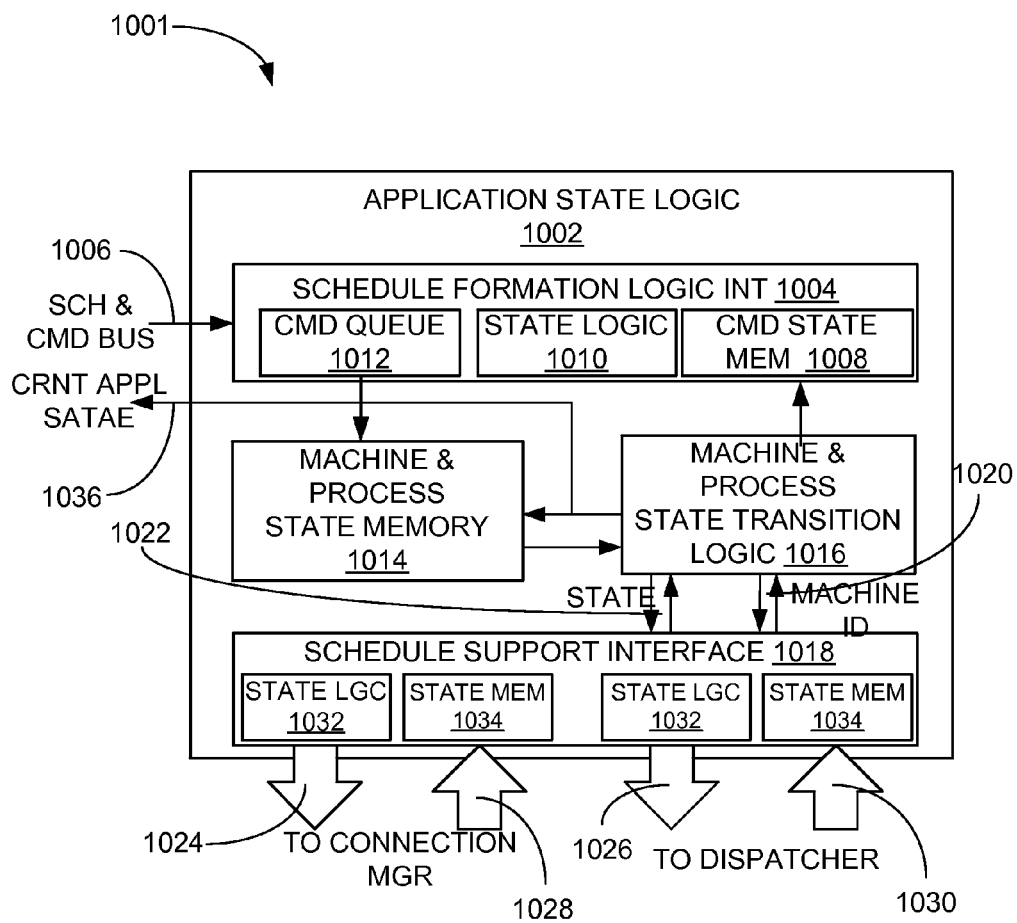
FIG. 10 is a hardware block diagram of an application state logic in an embodiment of the state logic segment of FIG. 9.

Referring now to FIG. 10, therein is shown a hardware block diagram of an application state logic 1001 in an embodiment of the state logic segment 924 of FIG. 9. The hardware block diagram of the application state logic 1001 depicts an application state logic 1002 having a schedule formation logic interface 1004 that receives command execution requests from a schedule command bus 1006. Upon receiving the command execution request from the schedule command bus 1006, the schedule formation logic interface 1004 can parse the command execution request by activating a command state module 1008 to initiate a command execution state machine (not shown).

The schedule formation logic interface 1004 further interrogates a state logic module 1010 to identify the circuit resources of the reconfigurable hardware devices 202 of FIG. 2 that are assigned as the committed logic (not shown) required to execute the command execution requests. The schedule formation logic interface 1004 can then activate a command queue module 1012 that enters the command execution request with the associated committed logic into a machine and process state memory 1014, such as dual FIFO structure for providing a lookahead execution capability.

The machine and process state memory 1014 can exchange state machine execution information with a machine and process state transition module 1016 for monitoring the progress of the requested command execution. The machine and process state transition module 1016 is communicatively coupled to a schedule support interface module 1018. The coupling between the machine and process state transition module 1016 and the schedule support interface module 1018 includes a state machine ID bus 1020 and state machine status bus 1022, both of which have ingress and egress ports to support multi-threaded command execution.

The schedule support interface module 1018 acts as a portal for passing command execution information to a connection manager output bus 1024 and a dispatcher output bus 1026 for further coordination of the command execution and progress of the application 304 of FIG. 3. The schedule support interface module 1018 also receives status and priority information through a connection manager input bus 1028 and a dispatcher input bus 1030.

The schedule support interface module 1018 includes a state logic module 1032 for providing information about the committed logic associated with the state of command execution. The state logic module 1032 can be replicated for driving the connection manager output bus 1024 and the dispatcher output bus 1026 independently. The duplication of the state logic module 1032 further supports the multi-threaded execution of commands from the applications 304.

The schedule support interface module 1018 also includes a state memory module 1034 can be replicated for receiving information about status and priority of the command execution from the connection manager input bus 1028 and the dispatcher input bus 1030. The duplication of the state memory module 1034 further supports the multi-threaded execution of commands from the applications 304.

Upon completion of activities surrounding the requested command execution, the machine and process state transition module 1016 sends a response to the schedule formation logic interface 1004 or triggers an event to alert the microkernel 604 of FIG. 6. The event can be communicated to the microkernel 604 through a current application status bus 1036 at the same time the machine and process state memory 1014 is notified. This notification can trigger the lookahead mechanism of the machine and process state memory 1014 and provide a reordering of the command execution in response to event.

The machine and process state transition module 1016 remains engaged to the machine or process unless either the machine or process is terminated by an action of the microkernel 604, the state machine operates to completion of the requested command execution, or the state machine is usurped by a higher priority inbound command.

The application state logic module 1002 ensures clean state transitions as the command execution of the application 304 proceeds through its life cycle. The application state logic 1001 tracks process and machine state and provides consistent state transitions for the command execution of the application 304. The application state logic 1001 accepts event notifications and interfaces with a schedule support layer (not shown), through the connection manager and the dispatcher, to either complete a process or machine state transition with all its implications, schedule the process or machine state transition, or discard the event information with no effect to the system state.

It is understood that the discussion of the application state logic 1001 describes the execution of a single instance of the application state logic module 1002 for simplicity only and other instances of the application state logic module 1002 can concurrently operate in a similar way. It is further understood that the hardware circuitry associated with the application state logic module 1002 does not rely on microcode or software to complete its operation.

Figure 11:
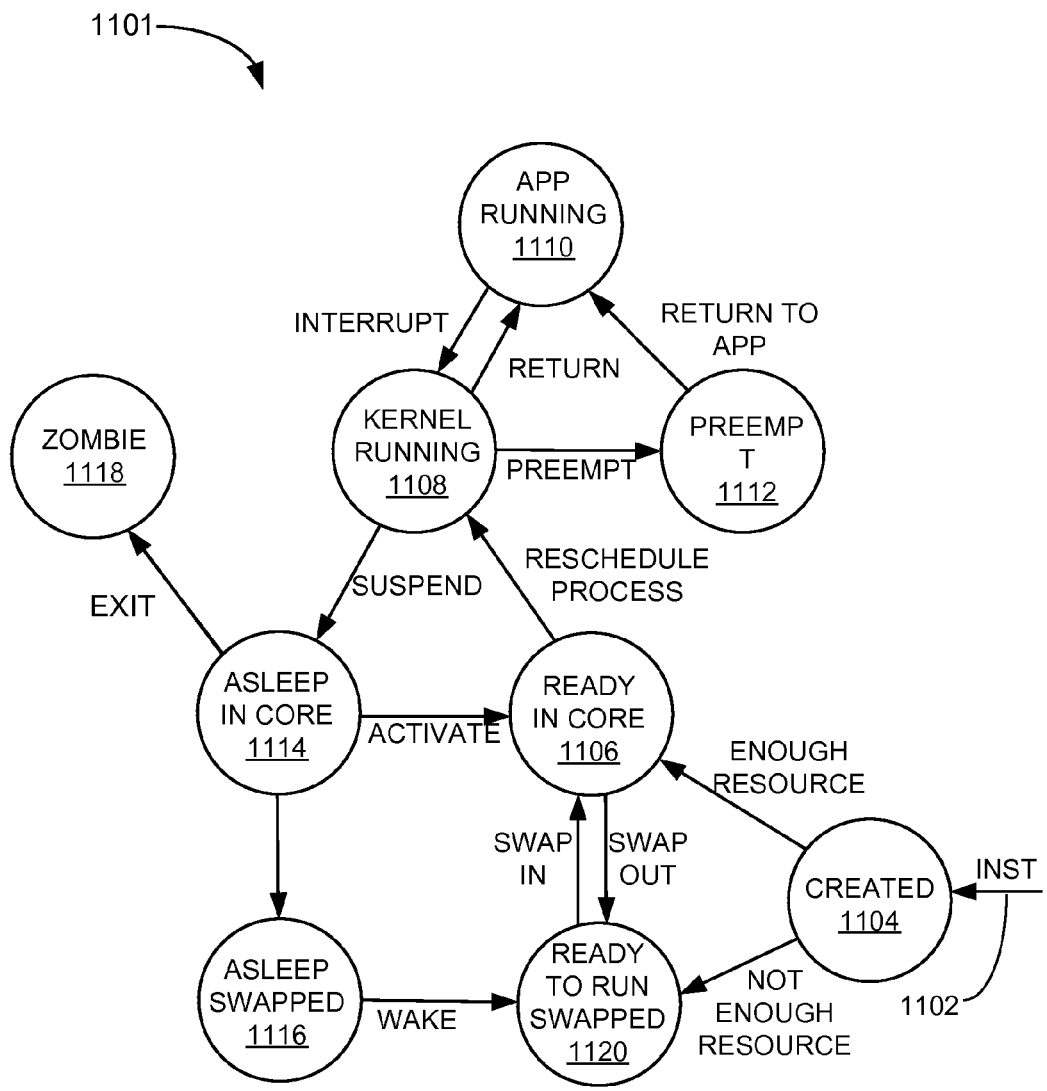
FIG. 11 is a hardware state transition diagram of a state machine as implemented in the machine and process state transition module of FIG. 10.

Referring now to FIG. 11, therein is shown a hardware state transition diagram of a state machine 1101 as implemented in the machine and process state transition module 1016 of FIG. 10. The hardware state transition diagram of the state machine 1101 depicts state transitions, which can be caused by asynchronous events or synchronous operation. Each of the states of the state machine represents the operational status of an instantiated machine formed of the circuit resources of the reconfigurable hardware devices 202 of FIG. 2 that are assigned as the committed logic (not shown). The entry to the state machine 1101 is an instantiate process 1102.

The instantiate process 1102 can be invoked by the microkernel 604 of FIG. 6 through the schedule command bus 1006 of FIG. 10. Once the resource circuitry of the reconfigurable hardware devices 202 is identified, a created state 1104 is entered and the state machine 1101 is engaged. If the resource circuitry of the reconfigurable hardware devices 202 is available and committed to the execution logic of the requested command, the state machine progresses to a ready in core state 1106 in preparation for its scheduled operation.

If the execution logic is immediately required the state machine 1101 can transition to the kernel running state 1108, indicating that the microkernel 604 of FIG. 6 has pre-loaded the execution logic for operation. The execution logic can immediately enter an application running state 1110 to perform the operations required by the application 304 of FIG. 3.

During the execution of the application 304, an interrupt can cause the state machine 1101 to return to the kernel running state 1108. The execution logic can be loaded with new conditions and returned to the application running state 1110 for continued operation. The execution logic can be preempted by other configurations of the circuitry resources of the reconfigurable hardware devices 202 as required by the application 304.

If the execution logic will be required by the application 304 within a few cycles the state machine 1101 enters a preempted state 1112 and is held until it can be returned to the application running state 1110. This hardware pause maintains the condition of the execution logic until it is once again returned to the application running state 1110.

If the execution logic has completed its useful tasks within the application, the state machine can enter a sleep in core state 1114 where the utility of the execution logic is examined to determine where it goes next. If the execution logic as configured will once again be require by the application 304, the execution logic can be activated and move to the ready in core state 1106. If the execution logic is associated with an application 304 that is paused by a higher priority version of the application 304, the execution logic can enter a sleep swapped state 1116 and await the return of the original version of the application 304.

If the application 304 has run to completion or been terminated by the microkernel 604, the state machine 1101 enters a zombie state 1118, where the execution logic can be decimated and returned to an uncommitted state in the reconfigurable hardware devices 202. Once the circuitry resources of the reconfigurable hardware devices 202 have been replenished they are available for implementation of other combinations to either compliment a combination that is awaiting resources or combined into some new combination that is once again ready to enter the created state 1104.

While the state machine 1101 is in the sleep swapped state 1116 the execution of the application 304 with which it is associated can be returned from hold, which can cause the state machine 1101 to transition to a ready to run swapped state 1120. The ready to run swapped state 1120 can also be entered from the created state 1104 if the circuitry resources of the reconfigurable hardware devices 202 were not readily available to commit the execution logic required for the application 304 with which it is associated.

While in the ready to run swapped state 1120 the execution logic can be scheduled to re-engage the application 304 and the state machine will progress to the ready in core state 1106. The most usual transition from the created state 1104 can be the to the ready to run swapped state 1120 while awaiting the circuitry resources of the reconfigurable hardware devices 202.

Once the application is scheduled, it waits in the schedule for a SIGALRM signal, indicating an application run timer has expired and that the circuitry resources of the reconfigurable hardware devices 202 will soon be made available for a different application. The schedule formation logic interface 1004 then recalls the reservation tables for the current time slot and the next time slot, then determines which applications are to be suspended. Once the released resources are marshaled, the dispatcher then receives one or more activate machine fragment messages from the application state logic 1001 that initiated the application 304. Each process of an application 304 that is multiplexed onto the execution logic has its own version of the state machine 1101. Together, a family of multiple instances of the state machine 1101 represent a computing system 100 of FIG. 1 and all of the processes of the application 304 running on that computing system 100.

It is understood that while the description of the computer system 100 has described a single version of the state machine 1101, other versions can be made to perform the same invention. The above description provides a hardware based execution process of the adaptive architecture execution environment.

Figure 12:
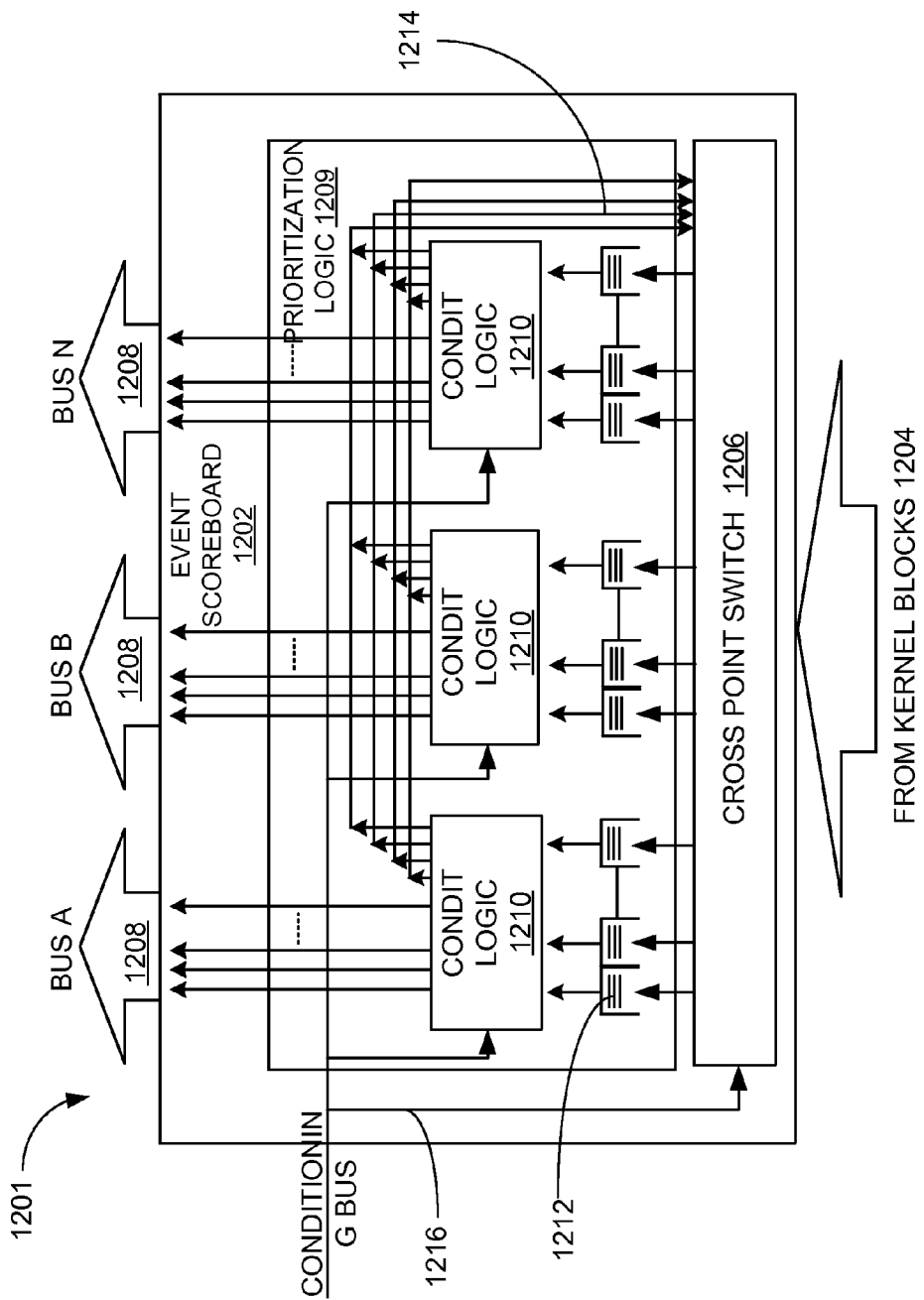
FIG. 12 is a hardware block diagram of an event scoreboard for providing status to the application agent module of FIG. 9.

Referring now to FIG. 12, therein is shown a hardware block diagram of an event scoreboard 1201 for providing status to the application agent module 901 of FIG. 9. The hardware block diagram of an event scoreboard 1201 depicts an event scoreboard module 1202 coupled to an event transport 1204. The an event transport 1204 can be implemented as a number of physical traces or lands on the event scoreboard module 1202, such as a printed circuit board, having a cross point switch 1206, such as a non-blocking cross point switch of size X by Y, mounted thereon. The variable nature of the an event transport 1204 can be configured into the cross point switch 1206 in order to support the variable widths required by the computing system 100 of FIG. 1.

It is understood that the cross point switch 1206 can be assembled from several physical hardware devices joined as a switch fabric that can route any inbound raw event signal stream from the an event transport 1204 to any output for further processing. It is further understood that the X by Y dimensions of the cross point switch 1206 can be any multiple of a single non-blocking cross point switch device that may be commercially available.

The event scoreboard module 1202 also supports distribution busses 1208 that can provide complex event information related to processing the application 304 of FIG. 3. The distribution busses 1208 can be of a variable width and can be configured at compile time or at run-time in order to process interrupts caused by event flags or error events. The distribution busses 1208 are electrically driven by a prioritization module 1209 having conditioning logic modules 1210 mounted thereon.

The conditioning logic modules 1210 are communicatively coupled to the cross point switch 1206 by cache register structures 1212, such as hardware register files or cache memory files. The cache register structures 1212 can be memory mapped to the internal logic of the conditioning logic modules 1210. The conditioning logic modules 1210 can include a set of internal registers, a block of embedded random access memory, a processing state machine, and a microcode memory, which is able to be down-loaded can manipulate the execution of the processing state machine.

The conditioning logic modules 1210 can also have a feedback output bus 1214, which is coupled back to the cross point switch 1206. The feedback output bus 1214 can be routed as a common bus for all of the conditioning logic modules 1210 and can be configured by the internal logic. The conditioning logic modules 1210 and the cross point switch 1206 can be configured by a conditioning bus 1216, which is used to load their internal configuration registers.

It has been discovered that the combination of the cross point switch 1206 and the conditioning logic modules 1210 can provide a low latency interrupt processing by providing a qualified path through the conditioning module 1210 upon receiving a qualifying interrupt. The cross point switch 1206 provides a real time routing structure while also enabling complex filtering of interrupt events through the conditioning logic modules 1210.

It has also been discovered that the feedback output bus 1214 can provide priority communication between the instances of the conditioning logic modules 1210 to provide still more complex interrupt processing through the internal circuitry of the conditioning module 1210, which includes the set of internal registers, the block of embedded random access memory, the processing state machine, and the microcode memory, for manipulating the execution of the processing state machine.

It is understood that any number of the conditioning logic modules 1210 and cache register structures 112 of FIG. 1 can be included in the implementation. While only three of the conditioning logic modules 1210 are shown in the FIG, it is understood that a different number can be implemented. It is further understood that any number of the distribution busses 1208 can be configured without impacting the performance of the interrupt processing due to the parallel nature of the implementation.

Figure 13:
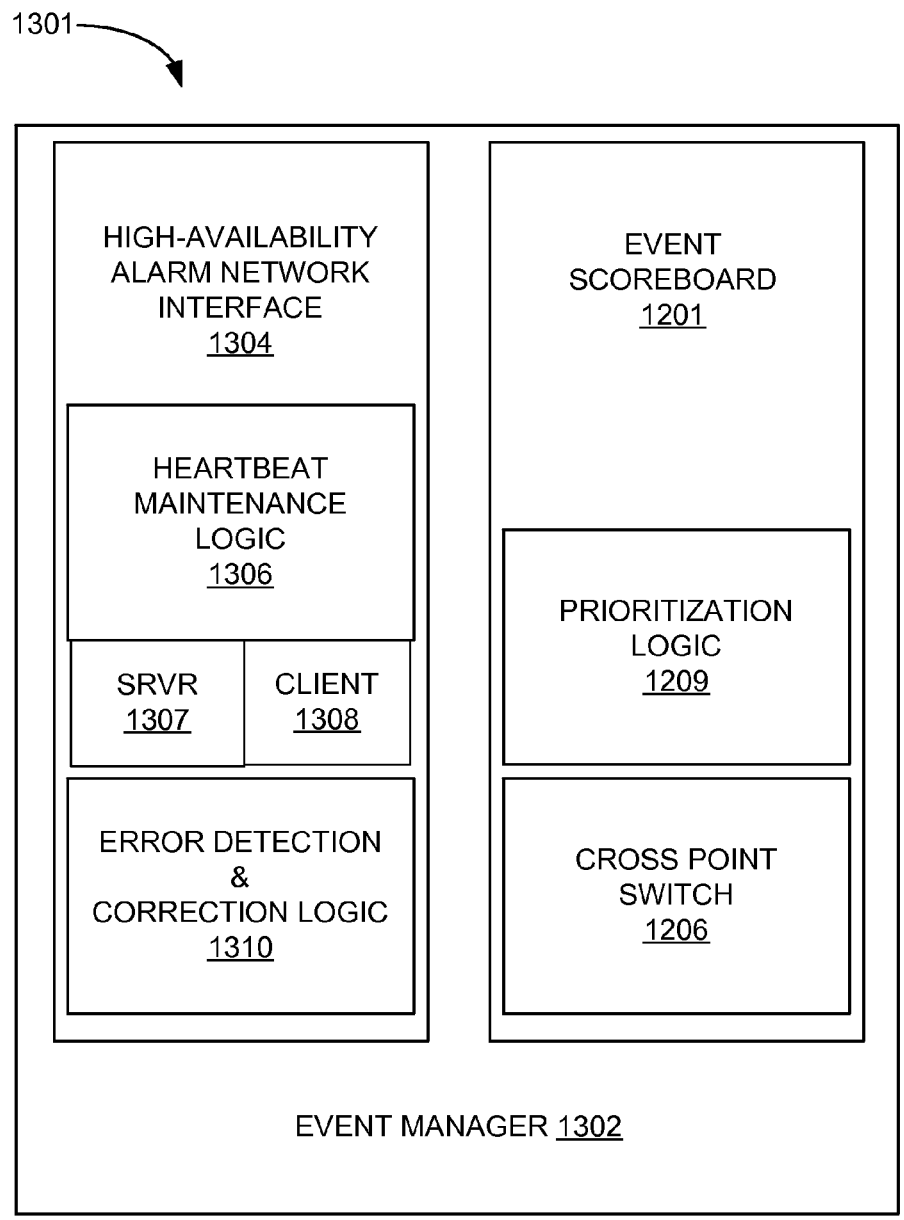
FIG. 13 is a hardware block diagram of an event manager module.

Referring now to FIG. 13, therein is shown a hardware block diagram of an event manager module 1302. The hardware block diagram of an event manager module 1302 depicts the event scoreboard 1201 having the prioritization logic 1209 and the cross point switch 1206. The event scoreboard 1201 works in conjunction with an alarm network interface 1304, which includes heartbeat maintenance logic 1306 and error detection and correction logic 1310.

The alarm network interface 1304 comprises a high-availability circuit function for providing heartbeat maintenance logic 1306, which maintains a system level heartbeat or communication pulse that coordinates the cooperative execution of distributed versions of the microkernel 604 of FIG. 4. The heartbeat maintenance logic 1306 consists of a server portion 1307 and a client portion 1308. The server portion 1307 of the heartbeat maintenance logic 1306 can send a broadcast message through a common interface that couples the remote instances of the microkernel 604 in a ring topology. The client portion 1308 of the heartbeat maintenance logic 1306 monitors the quality of the response to the responses in the ring topology to determine if one of the instances of the microkernel 604 has dropped out of the ring. The communication between remote instances of the microkernel 604 is important due to the distributed hardware topology whereby the circuitry resources of the reconfigurable hardware devices 202 can be utilized by any of the instances of the microkernel 604 that are within the ring topology.

It has been discovered that this extended configuration of the circuitry resources of the reconfigurable hardware devices 202 beyond the local instance of the microkernel 604 provides the ability to dynamically configure complex multithreaded versions of the application 304 of FIG. 3 within the computing system 100 of FIG. 1.

The error detection and correction logic 1310 employs additional error detection and correction logic beyond that which is included in the interface. The objective of this logic is to provide finer-grained error detection for diagnostic purposes. The error detection and correction logic 1310 employs extended block checking of the interface transfers.

Figure 14:
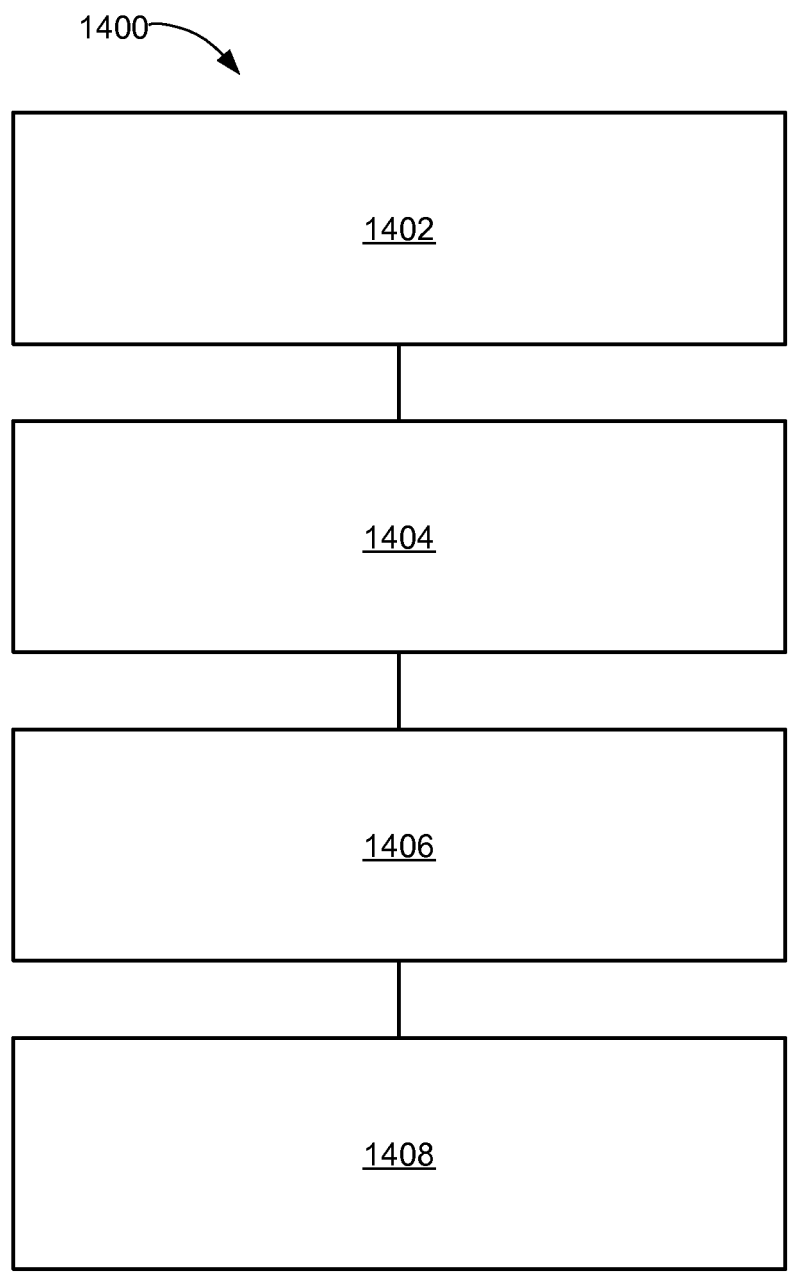
FIG. 14 is a flow chart of a method of operation of a computing system in a further embodiment of the present invention.

Referring now to FIG. 14, therein is shown a flow chart of a method 1400 of operation of a computing system in a further embodiment of the present invention. The method 1400 includes: providing a microkernel in a block 1402; controlling a reconfigurable hardware device by the microkernel in a block 1404; configuring an event scoreboard module for monitoring the reconfigurable hardware device in a block 1406; and implementing an application configured in the reconfigurable hardware device including receiving a machine identifier for the reconfigurable hardware device in a block 1408.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of an computing system comprising:
   providing a microkernel;

controlling a reconfigurable hardware device by the microkernel;
configuring an event scoreboard module for monitoring the reconfigurable hardware device; and
implementing an application configured in the reconfigurable hardware device including receiving a machine identifier for the reconfigurable hardware device.

2. The method as claimed in claim 1 further comprising:
configuring an event transport bus for transporting information from microkernel and the reconfigurable hardware device to the event scoreboard module; and
communicating an output from the event scoreboard, on a distribution bus, for transporting processed information based on the input from the event transport bus.

3. The method as claimed in claim 1 wherein:
configuring the event scoreboard module includes configuring a conditioning logic module; and
implementing the application includes monitoring an application state logic by the microkernel.

4. The method as claimed in claim 1 wherein controlling the reconfigurable hardware device includes:
instantiating a state machine for scheduling the reconfigurable hardware device by the microkernel; and
interrupting an application running state by receiving a status or priority information from a dispatcher input bus.

5. The method as claimed in claim 1 wherein controlling the reconfigurable hardware device by the microkernel further comprises:
configuring an event transport bus;
configuring a cross point switch coupled to the event transport bus;
writing information from the event transport bus into a cache register structure through the cross point switch;
configuring a conditioning logic module coupled to the cross point switch;
communicating through a feedback output bus information from the conditioning logic module to the cross point switch; and
configuring a distribution bus coupled to the output of the conditioning logic module.

6. A method of operation of an computing system comprising:
providing a microkernel including configuring a first kernel unit and a second kernel unit;
controlling a reconfigurable hardware device by the microkernel including signaling through a communication structure between the first kernel unit and the second kernel unit;
configuring an event scoreboard module for monitoring the reconfigurable hardware device including configuring a first distribution bus for the first kernel unit and a second distribution bus for the second kernel unit; and
implementing an application configured in the reconfigurable hardware device includes receiving a machine identifier for the reconfigurable hardware device including implementing distributed instances of the application by the first kernel unit and the second kernel unit.

7. The method as claimed in claim 6 further comprising:
configuring an event transport bus between the microkernel and the event scoreboard module for transporting information from the microkernel and the reconfigurable hardware device to the event scoreboard module for supporting multi-threaded instances of the application; and activating a feedback output bus in the event scoreboard module including configuring the event transport bus for monitoring multiple instances of the reconfigurable hardware device.

8. The method as claimed in claim 6 wherein:
configuring the event scoreboard module includes configuring a conditioning logic module including establishing temporal masks for detecting events by a prioritization logic; and
monitoring a buffer level for each instance of the application in the event scoreboard module.

9. The method as claimed in claim 6 wherein controlling the reconfigurable hardware devices includes:
instantiating a state machine for scheduling the reconfigurable hardware devices by the microkernel including mapping extended logic segments managed by the second kernel unit; and
interrupting an application running state by receiving a status or priority information from a dispatcher input bus including monitoring a heartbeat signal from the second kernel unit.

10. The method as claimed in claim 6 wherein controlling the reconfigurable hardware device by the microkernel further comprises:
providing an event transport bus;
configuring a cross point switch coupled to the event transport bus;
writing a cache register structure, with information from the event transport bus, through the cross point switch;
configuring a conditioning logic module coupled to the cross point switch;
communicating through a feedback output bus information from the conditioning logic module for acknowledging through the cross point switch; and
providing a distribution bus coupled to the output of the conditioning logic module including:
configuring a conditioning logic module by exercising a conditioning bus, and
detecting an alarm including notifying an event manager.

11. A computing system comprising:
a reconfigurable hardware device on a circuit board;
a microkernel having an event scoreboard module coupled to the reconfigurable hardware device for monitoring the reconfigurable hardware device; and
a machine identifier bus coupled to the reconfigurable hardware device for implementing an application configured in the reconfigurable hardware device.

12. The system as claimed in claim 11 further comprising:
an event transport bus for transporting information between the microkernel and the reconfigurable hardware device; and
a distribution bus coupled to the output of the event scoreboard.

13. The system as claimed in claim 11 wherein:
the event scoreboard module includes a conditioning logic module; and
an application state logic monitored by the microkernel for implementing the application.

14. The system as claimed in claim 11 wherein the microkernel includes:
a state machine for scheduling the reconfigurable hardware device; and
an application running state in the state machine coupled to a dispatcher input bus.

15. The system as claimed in claim 11 wherein the microkernel includes:

an event transport bus;
a cross point switch coupled to the event transport bus;
a cache register structure written through the cross point switch;
a feedback output bus coupled to the cross point switch for acknowledging through the cross point switch; and
a distribution bus including:
   a conditioning logic module communicatively coupled to the cross point switch through the cache register structure, and
   a conditioning bus coupled to the conditioning logic module.

16. The system as claimed in claim 11 further comprising:
a first kernel unit on the circuit board;
a second kernel unit on the circuit board;
a communication structure between the first kernel unit and the second kernel unit;
a first distribution bus for the first kernel unit; and
a second distribution bus for the second kernel unit for implementing multi-threaded instances of the application by the first kernel unit and the second kernel unit.

17. The system as claimed in claim 16 further comprising:
an event transport bus between the microkernel and the event scoreboard module includes a distribution bus width changed for supporting multi-threaded instances of the application; and
a feedback output bus in the event scoreboard module includes the event transport bus configured for monitoring multiple instances of the reconfigurable hardware device.

18. The system as claimed in claim 16 wherein:
the event scoreboard module includes a conditioning logic module configured for establishing temporal masks for detecting events by the prioritization logic; and
a cache register structure in the event scoreboard module for monitoring each instance of the application.

19. The system as claimed in claim 16 further comprising:
a state machine for scheduling the reconfigurable hardware devices including extended logic segments managed by the second kernel unit (408); and
an application running state in the state machine coupled to a dispatcher input bus includes a heartbeat server in the second kernel unit.

20. The system as claimed in claim 16 wherein the microkernel further comprises:
an event transport bus;
a cross-point switch;
a cache register structure written through the cross point switch;
a feedback output bus coupled to the cross point switch; and
a distribution bus coupled to the output of the event transport bus;
a conditioning logic module communicatively coupled to the cross point switch;
an event manager having a heartbeat maintenance logic coupled to the conditioning logic module; and
a conditioning bus coupled to the conditioning logic module for sending an alarm on the distribution bus.

* * * * *